United States Patent [19]
Yanagihara et al.

[11] Patent Number: 5,617,181
[45] Date of Patent: Apr. 1, 1997

[54] EXPOSURE APPARATUS AND EXPOSURE METHOD

[75] Inventors: Masamitsu Yanagihara; Hiroshi Shirasu, both of Yokohama; Tetsuo Kikuchi, Tokyo, all of Japan

[73] Assignee: Nikon Corporation, Japan

[21] Appl. No.: 618,735

[22] Filed: Mar. 15, 1996

Related U.S. Application Data

[63] Continuation of Ser. No. 430,074, Apr. 27, 1995, abandoned.

[30] Foreign Application Priority Data

Apr. 28, 1994 [JP] Japan .................................. 6-114781

[51] Int. Cl.$^6$ .......................... H01L 21/027; G03B 27/72
[52] U.S. Cl. .................. 355/46; 355/53; 355/68
[58] Field of Search .................. 355/46, 40, 67, 355/53, 70, 68, 77

[56] References Cited

U.S. PATENT DOCUMENTS

| | | | |
|---|---|---|---|
| 3,887,279 | 6/1975 | Rubin | 355/38 |
| 3,984,187 | 10/1976 | Bestenreiner et al. | 355/80 |
| 4,264,195 | 4/1981 | Tokuda et al. | 355/38 |
| 4,970,546 | 11/1990 | Suzuki et al. | 355/53 |
| 5,343,271 | 9/1994 | Morishige | 355/53 |
| 5,359,389 | 10/1994 | Isohata | 355/53 |

Primary Examiner—Arthur T. Grimley
Assistant Examiner—Herbert V. Kerner
Attorney, Agent, or Firm—Pennie & Edmonds

[57] ABSTRACT

An exposure apparatus and an exposure method for fabricating semiconductor devices or liquid crystal display boards. The scanning means synchronously moves the mask and the photosensitive substrate with respect to the plurality of projection optical systems, and patterns formed on the mask are projected onto the photosensitive substrate while images of mask formed by adjacent illumination optical systems are made overlapping with each other. On this occasion, the controlling means controls the light intensity changing means, and the light intensity changing means changes the intensity of a light beam of each illumination optical system, so that two intensities of overlapping parts in adjacent illumination areas become substantially equal to each other. The control by the controlling means is carried out based on the light intensities of the overlapping illumination areas as detected by the light intensity detecting means.

25 Claims, 5 Drawing Sheets

EXPOSURE APPARATUS AND EXPOSURE METHOD

This is a continuation of application Ser. No. 08/430,074, filed Apr. 27, 1995, now abandoned.

BACKGROUND OF THE INVENTION

1. Field of the Invention

The present invention relates to an exposure apparatus and an exposure method for fabricating semiconductor devices or liquid crystal display boards, and more particularly to those with a plurality of illumination optical systems.

2. Related Background Art

The liquid crystal display boards have frequently been used as a display device for personal computers, televisions, etc. these days. The liquid crystal display boards are produced by patterning a transparent thin-film electrode in a desired pattern on a glass substrate by the technique of photolithography. Used as apparatus for the photolithography are projection exposure apparatus for performing exposure of a photomask pattern formed on a mask, on a photoresist layer on the glass substrate through a projection optical system.

There is a recent demand to increase the area of liquid crystal display board, with which the projection exposure apparatus are also demanded to have an enlarged exposure area. A scanning exposure apparatus provided with a plurality of projection optical systems is a conceivable means for expanding the exposure area. Namely, a light beam emitted from a light source is guided through an optical system including a fly's eye lens etc. to average quantities of light and thereafter the light beam is shaped in a desired cross section by a field stop to illuminate an area on a pattern surface of mask. A plurality of optical systems (illumination optical systems) of such structure are arranged to illuminate different small regions (illumination areas) on the mask with light beams emitted from the respective illumination optical systems. Light beams passing through the mask travel through respective, different projection optical systems to form pattern images of mask in different projection areas on the glass substrate. Then the mask and glass substrate are synchronously moved relative to the projection optical systems, whereby the entire surface of pattern area on the mask is transcribed onto the glass substrate.

SUMMARY OF THE INVENTION

In the present invention, an exposure apparatus is provided with a plurality of illumination optical systems each for applying a light beam from a light source to a part of a pattern area, a plurality of projection optical systems, arranged as displaced from each other along a predetermined direction and in a direction perpendicular to the predetermined direction, for projecting respective images from the light beams passing through the mask onto a photosensitive substrate so that adjacent images overlap with each other at positions in the predetermined direction, scanning means for synchronously moving the mask and the photosensitive substrate relative to the projection optical systems in a direction substantially perpendicular to said predetermined direction, light intensity changing means for changing an intensity of a light beam of each illumination optical system, light intensity detecting means, provided in a substantially same plane as the photosensitive substrate is, for detecting an intensity of each overlapping part out of the light beams emergent from the plurality of projection optical systems, and controlling means for controlling the light intensity changing means so that intensities of overlapping parts adjacent to each other may be substantially equal to each other, based on the intensities detected.

In the present invention, the scanning means synchronously moves the mask and the photosensitive substrate with respect to the plurality of projection optical systems, and patterns formed on the mask are projected onto the photosensitive substrate while images of mask formed by adjacent illumination optical systems are made overlapping with each other. On this occasion, the controlling means controls the light intensity changing means, and the light intensity changing means changes the intensity of a light beam of each illumination optical system; so that two intensities of overlapping parts in adjacent illumination areas become substantially equal to each other. The control by the controlling means is carried out based on the light intensities of the overlapping illumination areas as detected by the light intensity detecting means.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the case of the scanning exposure apparatus provided with a plurality of illumination optical systems, the plurality of illumination optical systems need to have uniform intensities of respective light beams thereof and thus, the apparatus is normally arranged to perform such a control than a light intensity of each illumination optical system indicates a predetermined reference value. This can make an average intensity of a light beam of one illumination area coincident with that of another.

The scanning exposure apparatus, however, does not have correcting means for correcting intensity variations in each illumination optical system, and, therefore, the apparatus has a problem that differences appear between the light beam intensities in an entire illumination area, corresponding to the intensity variations.

Also, the light beam intensity differences become a cause of changes in line widths of exposure patterns. The changes of line widths imply changes in characteristics of devices finally obtained. A steep change of line widths, caused by a light intensity change in a joint part between the illumination optical systems would result in a big change in characteristics of devices finally obtained. This would lower the quality of active matrix liquid crystal devices etc.

Figure 1:
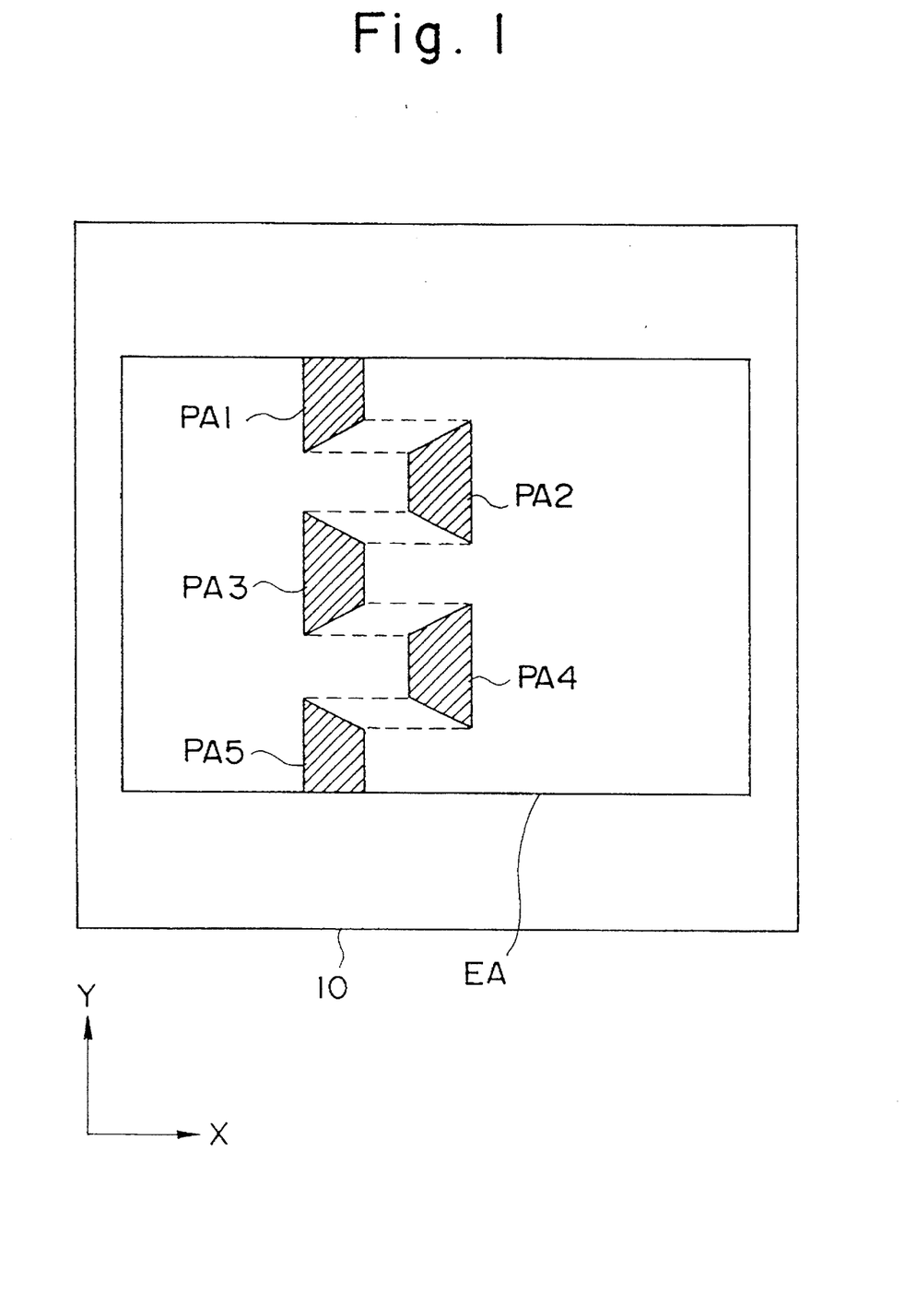
FIG. 1 is a drawing to show projection areas on a photosensitive substrate 10 in an exposure apparatus as an embodiment of the present invention.

Further, in order to prevent positional deviation of patterns in joint parts, the scanning exposure apparatus is arranged in such structure than each adjacent pair of projection areas PA1 to PA5 overlap with each other in a part thereof (for example, of about 5 [mm]) as shown in FIG. 1. Similarly, the illumination regions also overlap with each other in a part thereof. Thus, if a change of the light beam intensity or light quantity to the photoresist occurs within a narrow range of about 5 [mm], the line widths of exposure patterns quickly change in the region, raising a possibility that the overlapping parts are recognized as lines or belts as a result. On the other hand, increasing the width of the overlapping parts can overcome the quick changes of light beam intensities, but it will result in losing effective utilization of projection areas of the projection optical systems.

Figure 2A:
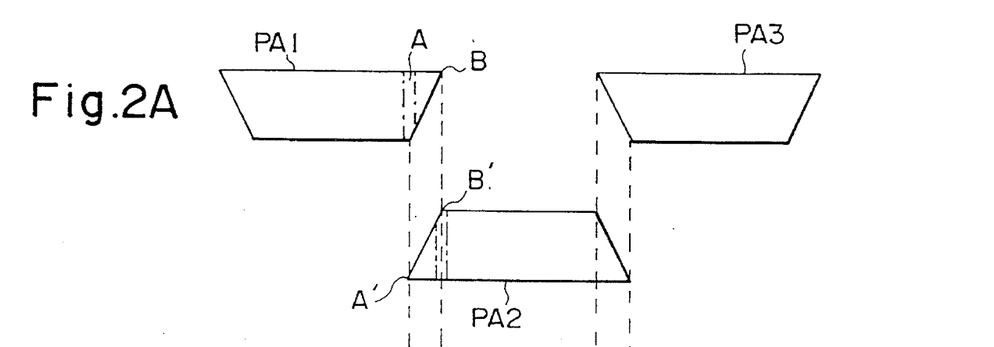
FIG. 2A is a drawing to show projection areas on a photosensitive substrate in a conventional exposure apparatus.
Figure 2B:
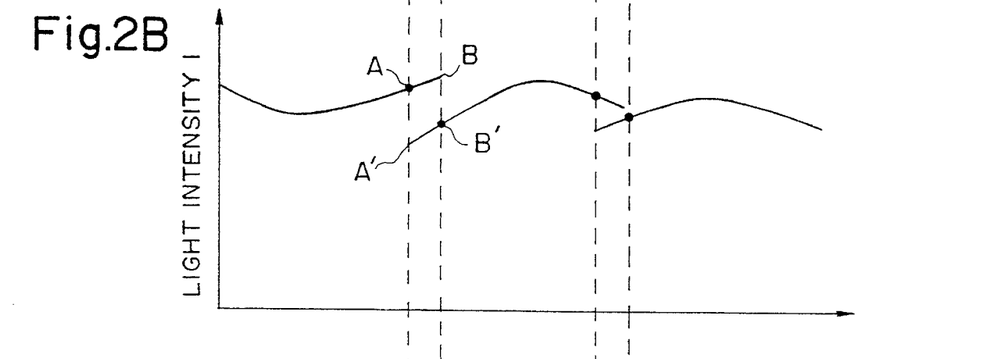
FIG. 2B is a drawing to show light intensity distributions of the respective projection areas shown in FIG. 2A.
Figure 2C:
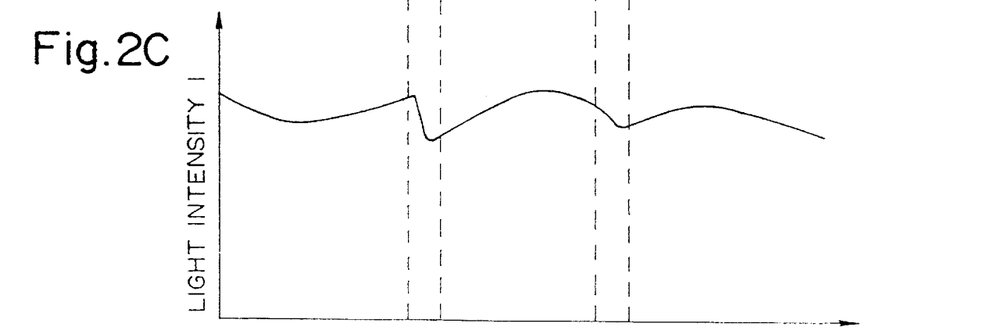
FIG. 2C is a drawing to show a combinational light intensity distribution obtained by combining the three light intensity distributions shown in FIG. 2B.

For example, projection areas PA1–PA3 by three projection optical systems, as shown in FIG. 2A, may have respective intensity distributions of light beams as shown in FIG. 2B. Let us assume in this case that average values of light intensities of the projection areas PA1–PA3 are nearly coincident with each other. However, light intensities of the overlapping parts in the respective regions are not coincident. When exposure is made with the regions PA1–PA3 of such light intensities overlapping with each other, a resultant light intensity distribution on the photosensitive substrate is as shown in FIG. 2C. This may be explained as follows. Comparing a part A, surrounded by an alternate long and shorn dash line, of area PA1 shown in FIG. 2A with part A' near the corner of the area PA2, an area of part A is larger than that of part A', and thus part A gives a greater effect on a point on the photosensitive substrate. Similarly, part B' surrounded by an alternate long and short dash line gives a greater effect on a point on the photosensitive substrate than part B near the corner. The light intensity distribution of images on the substrate at this moment shows steep intensity changes at joint parts as shown in FIG. 2C, thus resulting in steeply changing the line widths of exposure patterns. Portions with such steep changes are likely to be recognized as joint parts in liquid crystal display boards fabricated.

The present invention has been accomplished taking the above points into account, and provides an exposure apparatus which can minimize such steep changes of illumination light intensities.

Figure 3:
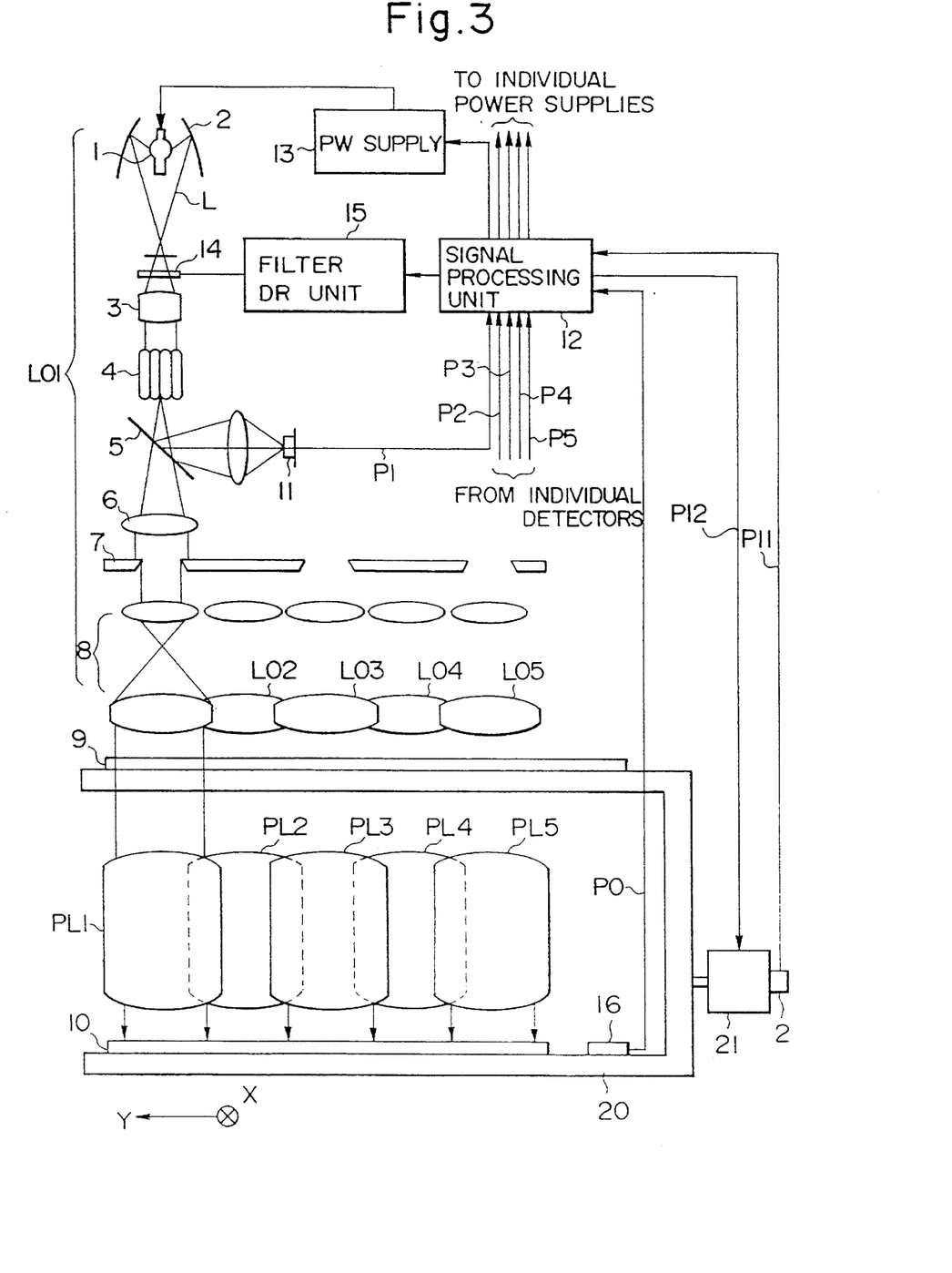
FIG. 3 is a drawing to show schematic structure of the exposure apparatus as an embodiment of the present invention.

FIG. 3 is a drawing to show schematic structure of the exposure apparatus as an embodiment of the present invention. A light beam L emitted from a light source 1 such as a super-high pressure mercury lamp is guided via an ellipsoidal mirror 2 and a lens system 3 and passes through a fly's eye lens 4, which makes an intensity of the beam consistent. Then the beam travels through a half mirror 5 and a lens system 6 and thereafter is shaped in a desired cross section by a field stop 7. The shaped beam passes through a lens system 8 to form an image of the field stop on a pattern surface of mask 9. There are a plurality of illumination optical systems (optical elements of from light source 1 to lens system 8, where the described system will be referred to as LO1) in this arrangement (but only a plurality of lens systems corresponding to the lens system 8 are shown in the drawing for convenience' sake, which are denoted by LO2 to LO5, respectively), and light beams emitted from the respective illumination optical systems illuminate different, small areas (illumination areas) on the mask 9. The plurality of light beams passing through the mask 9 then pass through respective, different projection optical systems PL1–PL5 to form pattern images, corresponding to the illumination regions on the mask 9, in projection areas (shown as PA1–PA5 in FIG. 1) on the photosensitive substrate 10. In this case, the projection optical systems PL1–PL5 each are a 1:1 erect system. The projection areas on the photosensitive substrate 10 are arranged, as shown in FIG. 1, in such an array that each two adjacent areas (for example, PA1 and PA2, PA2 and PA3, . . . ) are displaced a predetermined distance in the X direction in the drawing and that end parts (joint parts) of the each adjacent regions (in portions shown by the dashed lines in the drawing) overlap with each other in the Y direction in the drawing. Accordingly, the above plurality of projection optical systems PL1–PL5 are also arranged to be displaced the predetermined distance in the X direction and to overlap with each other in the Y direction in accordance with the arrangement of the projection areas PA1–PA5. An arrangement of the plurality of illumination optical systems LO1–LO5 is so determined that the illumination areas on the mask 9 are arranged in the same arrangement as the above projection areas PA1–PA5. Then the mask 9 and photosensitive substrate 10 are synchronously moved relative to the projection optical systems PL1–PL5 in the X direction (or in the direction normal to the plane of FIG. 3), whereby the entire surface of the pattern area on the mask 9 is transcribed onto the exposure area EA on the photosensitive substrate 10. The mask 9 and photosensitive substrate 10 are mounted on a C-shaped carriage 20. When a drive unit 21 moves the carriage 20 in the Y direction, the mask 9 and photosensitive substrate 10 are synchronously moved relative to the projection optical systems PL1–PL5.

Also, a half mirror 5 is provided in an optical path of each illumination optical system LO1–LO5 to let part of the light beam L enter a detector 11. The detector 11 detects an intensity of the light beam and outputs a signal P1–P5 obtained to a signal processing unit 12.

Incidentally, each detector 11 requires calibration as to variations of detection values of detector itself for every illumination optical system, including transmittances of optical elements constituting the illumination optical system and the projection optical system. For this purpose, a detector 16 is provided in such an arrangement that a light-receiving surface thereof is located within a same surface as the photosensitive substrate 10. An intensity signal P0 obtained from the detector 16 is output to the signal processing unit 12. A correction value of each detector can be determined by a ratio between the signal P0 and the detection signal P1–P5 of detector 11 in each illumination optical system. This enables more accurate control of intensities of light beams. Further, this detector 16 measures intensities of light beams in the joint parts between the projection areas PA1–PA5, and, therefore is arranged to be directly or indirectly movable for measurement in the every joint part of each illumination optical system and each projection optical system. In other words, the detector 16 is movable in the X direction in FIG. 3 while the carriage 20 is movable in the Y direction, whereby the detector 16 can move to any position in the projection areas PA1–PA5.

A light-receiving region of the detector 16 should be preferably determined not so large, taking account of sensitivity inconsistencies of a light-receiving device in the detector 16, and detects one or more intensities at an arbitrary point in a joint part to determine the intensity as an intensity of the joint part. Taking account of temporal changes of illumination ripples etc., this measurement may be done by performing a plurality of samplings at a same point and averaging them.

The above-described signal processing unit 12 obtains an intensity of a light beam of each illumination optical system, based on the signal P0 from the detector 16, and sets a light intensity of projection area PA3 located nearly at the center as a reference value out of these obtained intensities. Starting from the projection area as the reference in order (in the order of PA3, PA2, and PA1 and in the order of PA3, PA4, and PA5), the intensity of a light beam of each illumination optical system LO1–LO5 corresponding thereto is controlled so that intensities of the joint parts of overlapping projection areas in the projection areas PA1–PA5 become equal to each other. Namely, voltages applied to the light sources 13 are subjected to such feedback control as to make intensities of the other light beams equal to the reference value. Here, intervals for the signal processing unit 12 to process the signals P1–P5 may be arbitrarily set with necessity. Also, the signal processing unit 12 takes in signals from a detecting unit 22 attached to the drive unit 21 and, based on the signals, controls the position of carriage 20 through the drive unit 21.

In the case where some of the plurality of light sources 1 are exchanged for new ones and, therefore, where new and old light sources 1 are mixed, it becomes impossible to effect such control to keep the intensities of the light beams constant by simply controlling the applied voltages in the above-described manner. Thus, a filter such as ND (neutral density) filter 14 is arranged in each optical path of illumination optical system LO1–LO5 so as to be see in or off the light beam L, and a filter drive unit 15 is controlled based on a signal from the signal processing unit 12. This arrangement can weaken an intensity of a light source emitting a strong light beam over an adjustment range of applied voltage. Preparing a plurality of ND filters 14 with different transmittances, they may be used as changing one to another or in combination. Also, the linearity of detection signals of detector can be checked by changing over the ND filters 14.

Figure 4A:
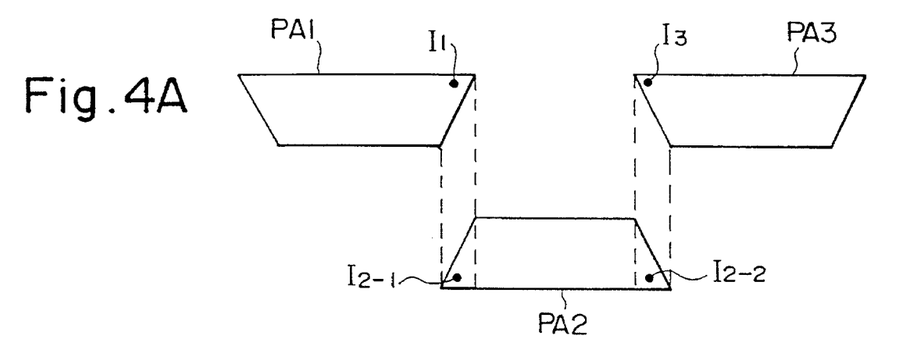
FIG. 4A is a drawing to show projection areas on a photosensitive substrate in the exposure apparatus of the embodiment of the present invention.
Figure 4B:
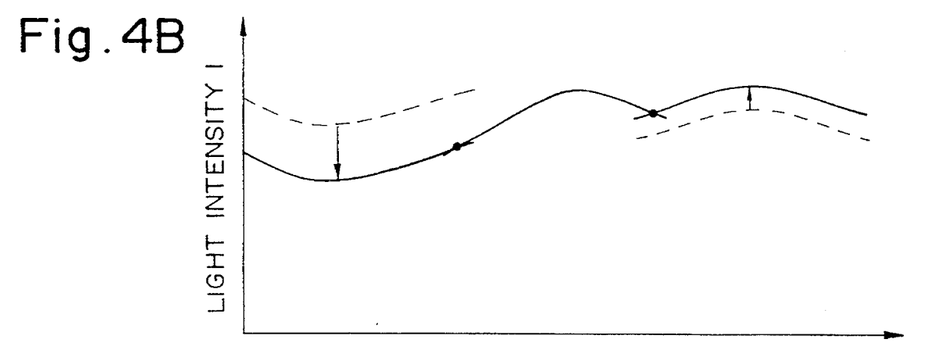
FIG. 4B is a drawing to show light intensity distributions obtained after intensities of light sources have been controlled for the respective projection areas shown in FIG. 4A.
Figure 4C:
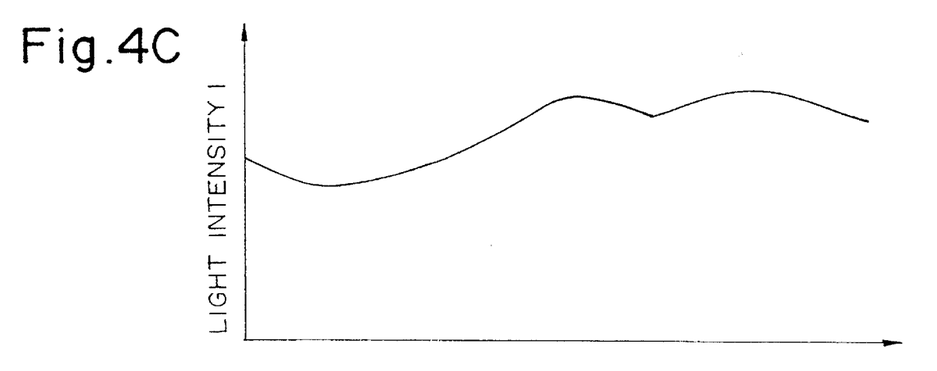
FIG. 4C is a drawing to show a combinational light intensity distribution obtained by combining the three light intensity distributions shown in FIG. 4B.

In the above structure, an example of light intensity control in the joint parts of projection areas by the three projection optical systems is shown in FIG. 4A to FIG. 4C. First, the detector 16 detects intensities of light beams at arbitrary points $I_1$, $I_{2-1}$, $I_{2-2}$, $I_3$ in the overlapping joint parts in the projection areas PA1–PA3, and the detected intensities are stored.

Next, an intensity of reference for control is determined. For example, let intensities of projection area PA2 located at the center be the reference. In this case, the intensities of the light beam of projection area PA2 are not changed. After than, an intensity of a light beam of each illumination optical system is controlled so that intensities at point $I_1$ in the joint part of projection area PA1 and at point $I_3$ in the joint part of projection area PA3, corresponding to the reference points $I_{2-1}$ and $I_{2-2}$, respectively, in the joint parts in projection area PA2, become nearly equal to those at $I_{2-1}$ and $I_{2-2}$, respectively. As for the intensity of the light beam of projection area PA1, the intensity at point $I_1$ is controlled so as to be equal to that at the reference point $I_{2-1}$ while monitoring the intensity at point $I_1$ in the joint part by the detector 16. Similarly, for the projection area PA3, the intensity at point $I_3$ in the joint part is controlled so as to be equal to that an the reference point $I_{2-2}$. After the control, stored are values of detectors 11 in the illumination optical systems LO1–LO3 corresponding to the projection areas PA1–PA3.

Figure 5:
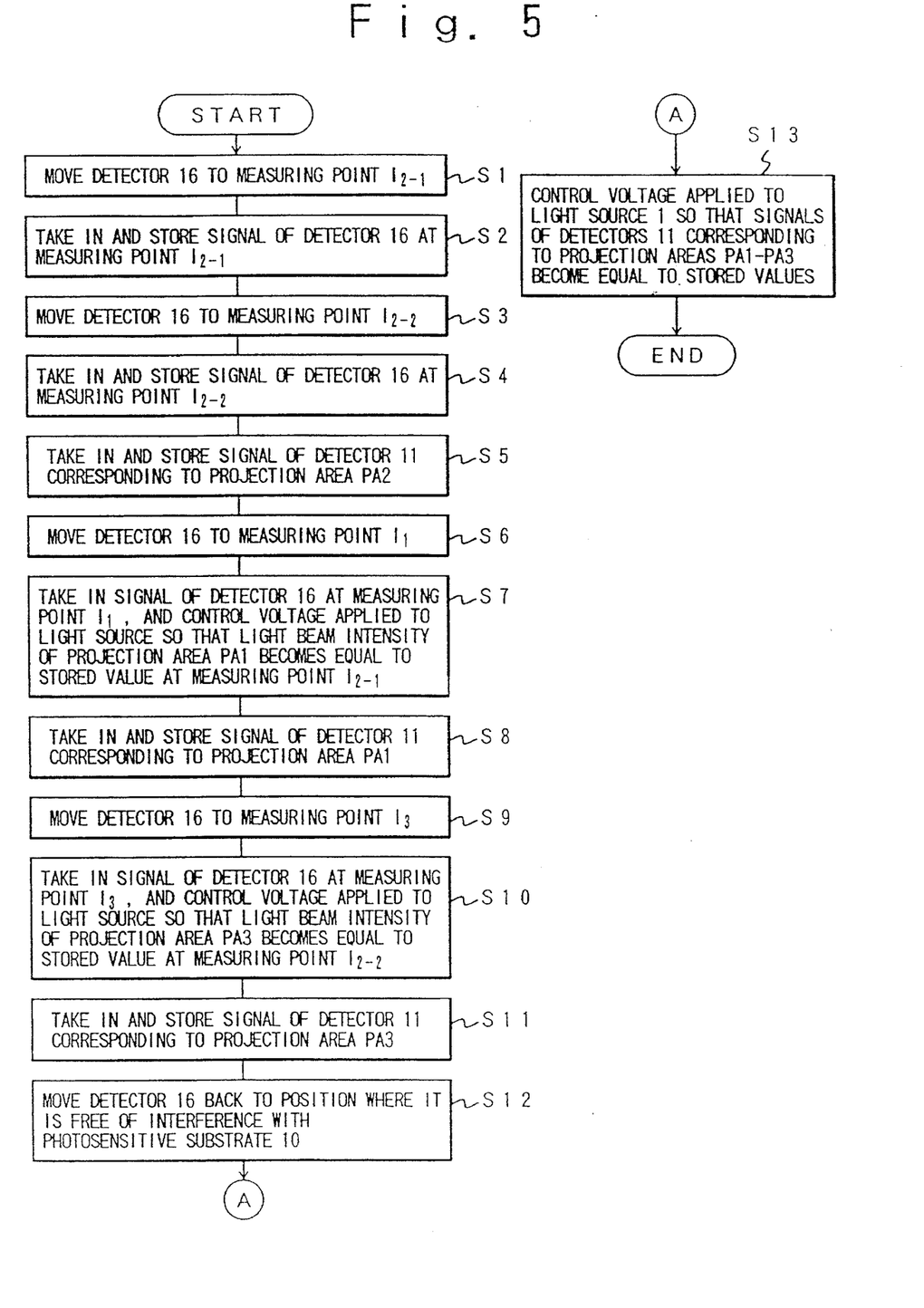
FIG. 5 is a flowchart to show the operation of the embodiment of the present invention.

After completion of correction of intensity in each joint part, a change with time is corrected by controlling the applied voltage to the light source 1 in each illumination optical system with the value of detector 11 stored as a reference. The above operation is summarized in the flowchart of FIG. 5. Since the intensities in the joint parts are matched based on the intensities once detected by the detector 16 and thereafter are independently controlled by the detectors 11 in the respective illumination optical systems in the above manner, measurements of light beam intensities in the joint parts using the detector 16 may be done on a periodic basis in order no compensate for errors due to changes with time.

According to the above arrangement, the intensity of each illumination optical system is controlled so that intensities of light beams in adjacent, overlapping, joint parts become coincident with each other, based on the light intensities of the joint parts detected by the detector 16, which can minimize the steep change of intensities of light beams in the joint parts in the projection areas.

Although the above embodiments were described as to the projection areas and intensities of light beams by the three projection optical systems as shown in FIGS. 2A and 4A, the present invention is by no means limited to it; for example, the invention can be applied to cases with four or more projection optical systems, achieving the same effects.

The above embodiments were described as to the apparatus with 1:1 projection optical systems, but the present invention is not limited to it; for example, the invention may be applied to apparatus with projection optical systems having a specified magnification or apparatus with reflection-type optical systems instead of the refraction-type optical systems.

Further, the above embodiments were described with the example of the field stop having a trapezoid aperture, but the present invention is not limited to it; for example, a field stop having a hexagonal aperture may be employed.

The above embodiments showed such an arrangement that the illumination optical systems and projection optical systems were arranged to achieve the arrangement of projection areas as shown in FIG. 1, but the present invention is not limited to it; the apparatus may be constructed in an arrangement excluding the illumination optical systems and projection optical systems forming the projection areas PA2, PA4 shown in FIG. 1. In this case, the entire surface of pattern area of mask can be transcribed onto the photosensitive substrate by moving the mask 9 and photosensitive substrate 10 in the X direction, giving a step by a predetermined amount in the Y direction, and again moving them in the opposite direction to the X direction.

Further, the above embodiments showed the examples in which the ND filter 14 and the applied voltage control to the light source 13 both were used as the light intensity changing means of each illumination optical system and the reference was taken at the intensities of the light beam of the projection area located at the center out of the plurality of projection areas, but the present invention is not limited to it; the applied voltage control to the light source 13 may be omitted by providing a plurality of ND filters 14. In this case, the filler drive unit 15 selects one of the plurality of ND filters 14. In the case where the apparatus has only the means for decreasing a light quantity, such as the ND filter, as the light intensity changing means of each illumination system as described, the lowest intensity is set as the reference. Further, the reference may be set at or near the center of a variable range by the filter or the applied voltage control. Further, in order to suppress measurement errors due to changes occurring in a short time range, such as the illumination ripples, an intensity of a light beam in a joint part may be measured by the detector 16 in the state that the applied voltage control etc. to the light source is effected by the detector 11.

As another arrangement, only one light source is provided, light from the light source is split into some beams by an optical system, the thus split beams are adjusted each into an appropriate intensity by the ND filter, and the adjusted beams are guided to respective projection areas. The splitting optical system used herein may be an optical fiber, for example, as described in U.S. patent application Ser. No. 08/259,771.

Also, matching with the lowest light intensity cut of those of a plurality of projection areas, light intensities of the other projection areas may be arranged to be lowered.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 6-114781 (114781/1994) filed on Apr. 28, 1994 is hereby incorporated by reference.

What is claimed is:

1. An exposure apparatus for transcribing a pattern on a mask onto a photosensitive substrate, which comprises:

a first illumination optical system, having a first light source, for applying a light beam from said first light source to a part of a pattern area on the mask;

a second illumination optical system, having a second light source, for applying a light beam from said second light source to a part of the pattern area on the mask;

a first projection optical system for projecting a light beam from said first illumination optical system onto a first projection area on the photosensitive substrate;

a second projection optical system for projecting a light beam from said second illumination optical system onto a second projection area on the photosensitive substrate, a part of an area on the photosensitive substrate exposed by said first projection optical system and a part of an area on the photosensitive substrate exposed by said second projection optical system overlapping with each other;

a scanning mechanism for making said first and second projection areas scan an area on the photosensitive substrate by moving the mask and the photosensitive substrate synchronously as against said first and second projection optical systems;

a light intensity changing device for changing at least one of a light intensity of a light beam of said first illumination optical system and a light intensity of a light beam of said second illumination optical system;

a light intensity detector for detecting effects of said first and second projection optical systems in a superimposed exposure area formed by superimposition in said first and second projection areas; and a controller for controlling said light intensity changing devices on the basis of a result from said light intensity detector.

2. An exposure apparatus according to claim 1, wherein said first illumination optical system comprises first light beam intensity detector for detecting the intensity of the light beam of said first illumination optical system, said second illumination optical system comprises second light beam intensity detector for detecting the intensity of the light beam of said second illumination optical system, and said controller controls said light intensity changing devices, based on the intensities of the light beams detected by said first and second light beam intensity detectors.

3. An exposure apparatus according to claim 1, wherein said controller controls an intensity of one, which corresponds to an area located farther from the center of the entire exposure area on the photosensitive substrate, out of said first and second illumination optical systems so as to make said intensity substantially coincident with an intensity of the other corresponding to an area nearer to the center of the entire exposure area on the photosensitive substrate.

4. An exposure apparatus according to claim 1, wherein out of said first projection area, a part corresponding to a region on the photosensitive substrate exposed as overlapping with the area exposed by said second projection area has a triangular shape and out of said second projection area, a part corresponding to a region on the photosensitive substrate exposed as overlapping with the area exposed by said first projection area has a triangular shape.

5. An exposure apparatus according to claim 1, wherein a shape of said first projection area is trapezoid.

6. An exposure apparatus according to claim 1, wherein said light intensity changing device controls a voltage applied to said first light source.

7. An exposure apparatus according to claim 1, wherein said light intensity changing device takes a filter into or out of the light beam of said first illumination optical system.

8. An exposure apparatus according to claim 7, wherein said filter is an ND filter.

9. An exposure apparatus according to claim 1, wherein said light intensity changing device changes over the filter set in the light beam of said first illumination optical system into another filter with a different transmittance.

10. An exposure apparatus according to claim 9, wherein said filter is an ND filter.

11. An exposure apparatus for transcribing a pattern on a mask onto a photosensitive substrate, which comprises;

a light source;

a splitting optical system for splitting a light beam from said light source;

a first illumination optical system for applying a part of a light beam from said splitting optical system to a part of a pattern area on the mask;

a second illumination optical system for applying part of a light beam from said splitting optical system to a part of the pattern area on the mask;

a first projection optical system for projecting a light beam from said first illumination optical system onto a first projection area on the photosensitive substrate;

a second projection optical system for projecting a light beam from said second illumination optical system onto a second projection area on the photosensitive substrate, a part of an area on the photosensitive substrate exposed by said first projection optical system and a part of an area on the photosensitive substrate exposed by said second projection optical system overlapping with each other;

a scanning mechanism for making said first and second projection areas scan an area on the photosensitive substrate by moving the mask and the photosensitive substrate synchronously as against said first and second projection optical systems;

a first light intensity changing device for changing a light intensity of a light beam of said first illumination optical system;

a second light intensity changing device for changing a light intensity of a light beam of said second illumination optical system;

a first light intensity detector for respectively detecting intensities of a light beams which are projected from said first and second projection optical systems;

a second light intensity detector for detecting effects of said first and second projection optical systems in a superimposed exposure area formed by superimposition in said first and second projection areas; and a controller for controlling said first and second light intensity changing devices on the basis of results detected by said first and second light intensity detectors so that a light intensity of a part of said first projection area which effects superimposed exposure of the photosensitive substrate together with said second projection area may be substantially equal to a light intensity of a part of said second projection area which effects superimposed exposure of the photosensitive substrate together with said first projection area, based on the light intensities detected by said first and second light intensity detectors.

12. An exposure apparatus according to claim 11, wherein said first illumination optical system comprises first light beam intensity detector for detecting the intensity of the light beam of said first illumination optical system, said second illumination optical system comprises second light beam intensity detector for detecting the intensity of the light beam of said second illumination optical system, and said controller controls said first and second light intensity changing devices, based on the intensities of the light beams detected by said first and second light beam intensity detectors.

13. An exposure apparatus according to claim 11, wherein said controller controls an intensity of one, which corresponds to an area located farther from the center of the entire exposure area on the photosensitive substrate, out of said first and second illumination optical systems so as to make said intensity substantially coincident with an intensity of the other corresponding to an area nearer to the center of the entire exposure area on the photosensitive substrate.

14. An exposure apparatus according to claim 11, wherein out of said first projection area, a part corresponding to a region on the photosensitive substrate exposed as overlapping with the area exposed by said second projection area has a triangular shape and out of said second projection area, a part corresponding to a region on the photosensitive substrate exposed as overlapping with the area exposed by said first projection area has a triangular shape.

15. An exposure apparatus according to claim 11, wherein a shape of said first projection area is trapezoid.

16. An exposure apparatus according to claim 11, wherein said first light intensity changing device takes a filter into or out of the light beam of said first illumination optical system.

17. An exposure apparatus according to claim 16, wherein said filter is an ND filter.

18. An exposure apparatus according to claim 11, wherein said first light intensity changing device changes over the filter set in the light beam of said first illumination optical system into another filter with a different transmittance.

19. An exposure apparatus according to claim 18, wherein said filter is an ND filter.

20. An exposure method comprising:

a first step of detecting a light intensity of a part out of a first projection area on a photosensitive substrate projected by a first projection optical system, said part being exposed on the photosensitive substrate as overlapping with a second projection area on the photosensitive substrate projected by a second projection optical system;

a second step of detecting a light intensity of said second projection area, said part being exposed on the photosensitive substrate as overlapping with said first projection area; and a third step of transcribing a pattern on a mask onto the photosensitive substrate while controlling at least one of an intensity of a light beam of a first illumination optical system for supplying a light beam to said first projection optical system through the mask and an intensity of a light beam of a second illumination optical system for supplying a light beam to said second projection optical system through the mask so that the light intensities detected in said first and second steps may become substantially coincident with each other.

21. An exposure method according to claim 20, wherein the detection of the light intensity in said first step is carried out only at a point in said part.

22. An exposure method according to claim 20, wherein the detection of the light intensity in said first step is carried out at a plurality of points in said part.

23. An exposure method according to claim 22, wherein an average of detected data at said plurality of points is used as measurement data of the light intensity in said first step.

24. An exposure method according to claim 20, wherein the control of the intensities of the light beams of said first and second illumination optical systems in said third step is carried out so that the intensity of one, corresponding to an area farther from the center of an entire exposure area on the photosensitive substrate, out of said first and second illumination optical systems may become substantially coincident with the intensity of the other corresponding to the area closer to the center of the entire exposure area on the photosensitive substrate.

25. An exposure method according to claim 20, wherein the detection of the light intensity in said first step is carried out in a state that illumination ripples of said first illumination optical system are suppressed.

* * * * *